United States Patent [19]

Ramaprasad

[11] Patent Number: 4,838,950
[45] Date of Patent: Jun. 13, 1989

[54] STABILIZATION OF INTRACONNECTIONS AND INTERFACES

[75] Inventor: Kackadasam R. Ramaprasad, Lawrenceville, N.J.

[73] Assignee: Chronar Corp., Lawrenceville, N.J.

[21] Appl. No.: 185,070

[22] Filed: Apr. 22, 1988

[51] Int. Cl.$^4$ ..................... H01L 27/14; H01L 31/18
[52] U.S. Cl. .................................. 136/244; 136/258; 437/2; 437/4; 437/180; 437/181; 437/205; 357/30; 357/59
[58] Field of Search ........... 136/244, 258 AM; 437/2, 437/4, 180–181, 205, 210; 357/36 J, 30 K, 59 C

[56] References Cited

U.S. PATENT DOCUMENTS 4,675,466 6/1987 Ramaprasad ........................ 136/244
4,770,716 9/1988 Ramaprasad ........................ 136/244

Primary Examiner—Aaron Weisstuch
Attorney, Agent, or Firm—George E. Kersey

[57] ABSTRACT

Stabilization of energy sensitive semiconductive devices by forming initial electrodes which are exposed through an overlying layer of semiconductor, dipping the exposed first electrode and the semiconductor layer in colloidal solutions, or well stirred suspensions of specified metal hydroxides, such as those of nickel, chromium, cobalt or related metals, followed by rinsing the non-sensitive side of the device in de-ionized water. After air drying, the deposition of an overlying second electrode is carried out by a metallization technique. The device is then heated in air, at 150° C. for four hours.

16 Claims, 4 Drawing Sheets

○ CONTROL PANEL
● NICKEL HYDROXIDE TREATED PANEL

○ CONTROL PANEL
● NICKEL HYDROXIDE TREATED PANEL

NOTE: FIG. 3A = CONTROL PANEL
FIG. 3B = NICKEL HYDROXIDE TREATED

STABILIZATION OF INTRACONNECTIONS AND INTERFACES

BACKGROUND OF THE INVENTION

Electronic devices, including energy sensitive solar cells, are vulnerable to various types of degradation. The present invention is concerned with the stabilization of interfaces and intraconnections in devices, and more particularly to the stabilization of devices such as solar cells and integrated circuits.

One important kind of degradation arises from thermal soaking or cycling. In integrated circuits, thermal soaking destabilizes, for example, the aluminum/silicon interface because of inter-diffusion. Solar panels that convert light to electricity degrade in performance because of deterioration, for example in the case of amorphous silicon cells, of the electrical contact between a front electrode, usually conductive tin oxide, and a back electrode, usually aluminum. It is recalled that a common panel configuration of intraconnected amorphous silicon solar cells is glass/tin oxide/ p− a−Si:C:H/i− a−Si:H/n− a−Si:H/Al. Another degradation mode to be noted here is the interdiffusion of silicon and aluminum at the back contact interface.

The illustrative modes of degradation enumerated above are continuous and non-reversible, under thermal cycling. They seriously curtail the useful lifetime of the devices.

Amorphous silicon solar panels are manufactured, generally, by successive deposition of various layers on a suitable substrate. For example, transparent conductive tin oxide deposited on glass is a common substrate. Individual cells using this tin oxide as the front electrode are created by laser patterning the tin oxide. This is followed by the deposition of p−, i− and n− type of amorphous silicon based alloys. The semiconductor layers thus deposited on tin oxide are suitably scribed to expose thin lines of the underlying oxide(the front electrode) of demarcated cells. The final step is the deposition of the back electrode, for example aluminum, through an appropriate procedure to produce an intraconnected solar panel.

When amorphous silicon is opened up as described above to expose the underlying tin oxide front electrode, it is likely that the site thus created will not provide a good and stable contact on subsequent metallization and subjection to thermal cycling or soaking. Further, under the same conditions of thermal soaking, there is a gradual deterioration of the interface between silicon and the electrode like aluminum because of interdiffusion as indicated by accelerated testing and subsequent analysis.

Accordingly, it is an object of this invention to improve the quality of the intraconnections in devices, particularly the intraconnections in solar cells.

Another object of the invention is to reduce the degradation of the intraconnections that occurs during their thermal cycling, particularly in solar cells.

Still another object of the invention is to reduce the interdiffusion at interfaces, particularly in solar cells and integrated circuits, between a semiconductor and a metal contact.

SUMMARY OF THE INVENTION

In a previous invention for the stabilization of intraconnections and interfaces (K. R. Ramaprasad, U.S. Pat. No. 4,675,466), we improved the thermal stability of intraconnected semiconductor devices and interfaces by a multi-step dipping process, in which at least one of the dip solutions had dissolved metallic ions such as, for example, nickel ions. Even though this is a successful process, a search was initiated to discover better or even radically new approaches to enhance the thermal stability of semiconductor devices and interfaces. From a manufacturing point of view, it would be desirable to design a one step process which has all the benefits of the previous invention, but because of its simplicity, is more cost-effective. The present invention represents a one step process.

In accordance with the present invention, energy sensitive devices, such as solar cells, which will subsequently be fabricated into intraconnected panels, after exposure of the first (the front) electrode by standard methods of scribing, but before deposition of the second (the back) electrode via metallization, are dipped in a solution containing a specific chemical. This is followed by rinsing *only the backside* (*the non-sensitive side*) of the above dipped device in order to remove any extraneous chemical. De-ionized water is suitable for rinsing. After air drying at room temperature, the second electrode (for example, the aluminum back electrode) is metallized. The device is heated in air at 150° C. for one to five hours, 4 hours being the preferred time.

In another practice of the invention, integrated circuits incorporating silicon are treated as described above, that is, before aluminum metallization, a single dip in a solution containing a specific chemical, followed by rinsing of the non-sensitive side in de-ionized water and air drying. Aluminum metallization is now done followed by heating in air at 150° C. as described above.

In one practice of the invention, the panels containing the first electrode, such as exposed conductive tin oxide, are dipped in a solution, such as one containing colloidal metal hydroxide. In another practice of the invention, the panel could be dipped in a well stirred suspension of a metal hydroxide. The colloidal metallic hydroxide solution or the metallic hydroxide suspension in water is desirably of nickel, chromium, cobalt or other related metal. A suitable metal hydroxide is nickel hydroxide either as a colloidal solution or a well stirred suspension in water. The time of dipping is 10–60 seconds, preferably 30 seconds. The nickel ion concentration either in the nickel hydroxide colloidal solution or the well stirred suspension is in the range of about 0.002M to about 0.05M, the preferred value being about 0.02M. The dipping is followed by rinsing in de-ionized water of the non-sensitive side of the panel. Aluminum metallization is carried out appropriately for the panel, after air drying, to give the intraconnected cells. The subsequent heat treatment is as described above.

Another example of the method described in this invention is the dipping of integrated circuits incorporating silicon semiconductor according to the procedure described above for nickel hydroxide dip. This is done, as usual, before metallization. The hydroxide dip is followed by rinsing in de-ionized water of the non-sensitive side and air drying. Metallization is now carried out appropriate for the integrated circuit. Heat treatment following metallization is the same as described for solar panels.

The above applications are for illustrative purposes only and the extension of this one dip metal hydroxide methodology to other intraconnections and semiconductor/metal interfaces is obvious.

DESCRIPTION OF THE DRAWINGS

Other aspects of the invention will become apparent after considering several illustrative embodiments, taken in conjunction with the drawings in which.

DETAILED DESCRIPTION

Figure 1:
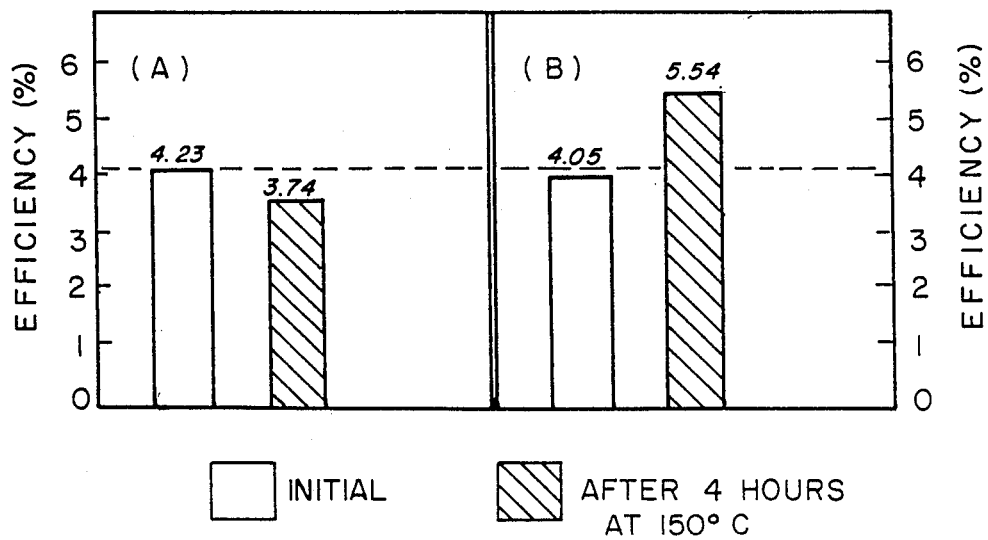
FIGS. 1A-1B compare the efficiency of untreated solar panels with that of panels treated in accordance with the present invention.

With reference to the drawings, FIG. 1 illustrates the beneficial effect of heating the panels, at 150° C. for about four hours after the metal hydroxide dipping described earlier. It is seen from FIG. 1A that the efficiency of the untreated control panel goes down from an initial value of 4.25% to a value of 3.74% after four hours at 150° C. In contrast, the panel dipped according to the present invention and heated, after depositing the back aluminum electrode, for four hours at 150° C. showed an improvement. The light-to-electricity conversion efficiency increased from an initial value of 4.05% to 5.54%, a value much better than that of the untreated panel.

The effect of thermal cycling, at 150° C. in air over a period of about 180 hours, on various photovoltaic parameters of intraconnected amorphous silicon solar panels is illustrated in the set of graphs in FIG. 2. Normalized values of the photovoltaic parameters have been plotted as a function of time of heating at 150° C. It is seen that, after thermal cycling at 150° C. for 180 hours (FIG. 2A), the $Al/SnO_2$ contact resistance for the intraconnected control panel increased about 30 times. In contrast, for the intraconnected panel treated according to the present invention, the $Al/SnO_2$ contact resistance increased by a factor of only about three under the same conditions. This clearly demonstrates the improved stability, under thermal cycling, that the method of the present invention endows to the $Al/SnO_2$ contact.

Figure 2A:
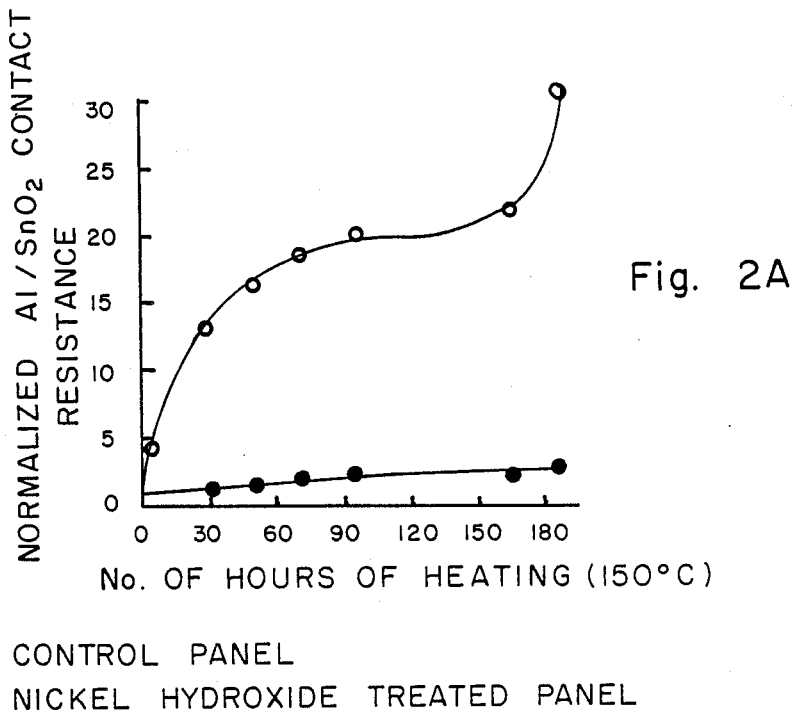
FIGS. 2A-2D are a set of graphs depicting the effect of thermal cycling, over prescribed periods, on various normalized photovoltaic parameters, comparing the untreated panels with those treated according to the present invention.
Figure 2B:
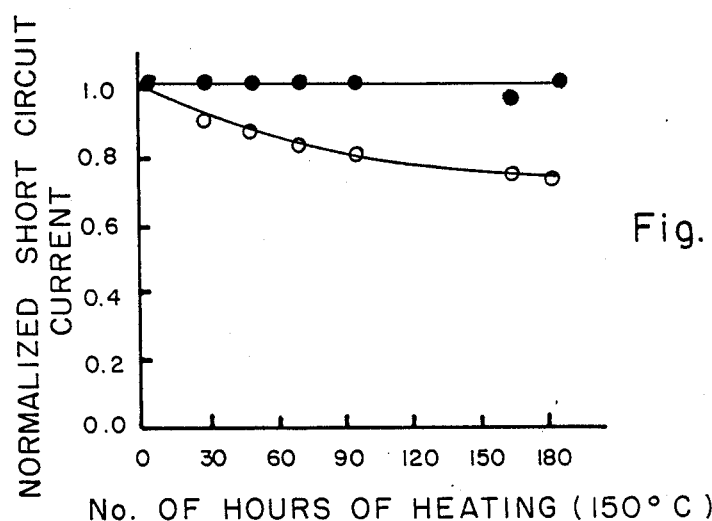
Figure 2C:
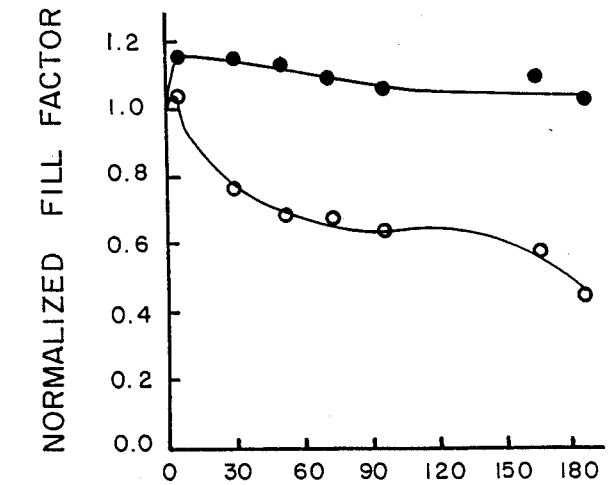
Figure 2D:
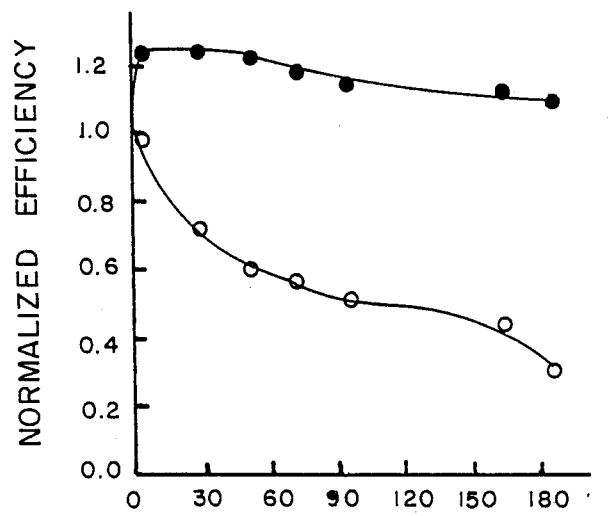

Referring to FIG. 2B, which shows the effect of thermal cycling at 150° C. on the short circuit current, it is observed that the control panel has suffered a short circuit current loss of about 27%, whereas the solar panel treated accorded to the present invention shows hardly any change in the value of this parameter.

Considering now the fill factor (FIG. 2C), the solar panels treated as described above show no change in the value of this parameter. In fact, after 4 hours of heating at 150° C., there is a 15% increase in fill factor, which after 180 hours stabilizes to the initial value. The control panel, during 180 hours of heating at 150° C., has suffered a loss in fill factor of more than 50%.

Similarly, the light-to-electricity conversion efficiency (FIG. 2D) of the control solar panel has decreased by about 70% after 180 hours at 150° C., whereas the panel treated according to this invention shows hardly any change.

Based on the results shown in the set of graphs comprising FIG. 2, and their explanation above, it can be concluded that the degradation of intraconnected solar panels considered here as a result of thermal cycling at elevated temperatures in air is mainly due to the deterioration of the $Al/SnO_2$ contact. The increased contact resistance manifests itself in considerable lowering of the fill factor, which in turn reduces the efficiency of the solar panels. The method of the present invention stabilizes this ($Al/SnO_2$) interface, even under thermal cycling, and thus ultimately stabilizes the electrical power output of the amorphous silicon solar panel.

It will be appreciated that the thermal cycling tests conducted at 150° C. represent significantly accelerated aging and correspond, in actual environmental exposure, to a substantially increased period of time, on the order of a number of years.

Figure 3A:
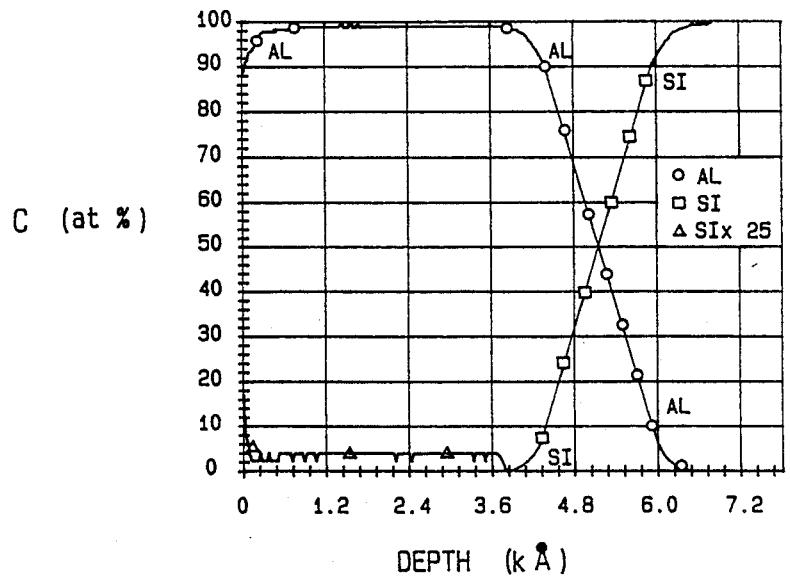
FIGS. 3A-3B are a comparison of the scanning Auger depth profiles of the untreated panel and that treated according to the present invention, showing the presence of silicon, if any, in the aluminum back electrode, after 632 hours of thermal cycling at 150° C.
Figure 3B:
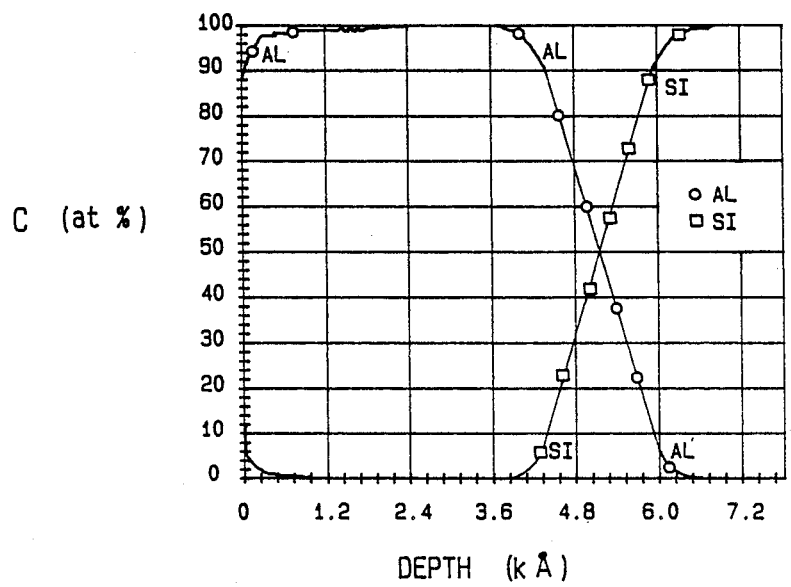

Another beneficial effect of the method of the present invention is the stabilization of a metal/semiconductor interface as, for example, Al/amorphous silicon in solar panels. This aspect of the invention can be extended also to other devices incorporating a metal/semiconductor interface, as in the case of integrated circuits. FIG. 3 is an illustration of this aspect of the invention. It depicts the Auger depth profiles of the Al-n type a-silicon interface of an amorphous silicon solar panel having the usual configuration of glass/$SnO_2$/p- a-Si:C:H/i- a-Si:H/n- a-Si:H/Al. FIG. 3A corresponds to the control panel and FIG. 3B to the panel treated in accordance with the present invention. Both the panels have been thermally cycled at 150° C. for 632 hours in air. It is observed that there is about 0.4% Si in aluminum as a result of out-diffusion of silicon in the control panel during thermal cycling. The expanded scale of the atomic % concentration for silicon, in FIG. 3A, is to be noted for the region zero to 3500 Å from the surface into the bulk. Under the same conditions, the panel treated according to the present invention shows an absence of silicon in aluminum within the Auger detectability limit which is less than 0.1%. This is a clear indication of the capability of the present invention to retard (or prevent) the out-diffusion of silicon into aluminum at the interface between the metal and a layer of silicon.

It has been theorized that the instability of the Al/$SnO_2$ interface arises due to the formation of an insulating layer of $Al_2O_3$, which then increases the contact resistance (E. Eser, et al, *Solar Cells,* 21, 25(1987) ). In amorphous silicon solar panels, with the exposed tin oxide front electrode, the beneficial effect of the present invention could arise because of a possible cleansing action on the one hand, thus preparing the panels for the subsequent metallization step. Secondly, the metal hydroxide colloid in water, or even the aqueous suspension of the said hydroxide (which is usually gelatinous) is very well adsorbed both on the tin oxide and the amorphous silicon. This adsorbed metal hydroxide, after metallization and treatment according to this invention, is in a chemical state to prevent the formation of an insulating $Al_2O_3$ layer between Al and $SnO_2$, thus preserving the integrity of the $Al/SnO_2$ interface. The adsorbed metal hydroxide at the other interface, viz., Al/a-Si, prevents the out-diffusion of silicon into the aluminum back electrode, thus retaining a well defined Al/a-Si interface, in spite of thermal cycling.

What is claimed is:

1. The method of stabilizing semiconductor devices with intraconnections, which comprises the steps of:
   (a) providing the device with a first electrode which is exposed through an overlying layer of semiconductor;
   (b) dipping the device in a colloidal solution of a metal hydroxide or a well stirred suspension of the said metal hydroxide in water;
   (c) providing a further contact with respect to the first contact.

2. The method of claim 1, wherein the non-sensitive or the back side of the said device is rinsed in de-ionized water after the dipping, but before providing the second contact 3. The method of claim 2 wherein the said device, after the second contact is provided, is heated in air at 150° C. for 4 hours.

4. The method of claim 1 wherein the dipping time is approximately 10 to 60 seconds.

5. The method of claim 1 wherein the said colloidal solution or well stirred suspension in water is that of nickel hydroxide.

6. The method of claim 5 wherein the nickel ion concentration either in the nickel hydroxide colloidal solution or a well stirred suspension is 0.02M.

7. The method of claim 1 wherein the metal hydroxide either as a colloidal solution or a well stirred suspension in water is that of chromium.

8. The method of claim 1 wherein the device is a constituent of a solar panel with a front electrode of conductive metal oxide which underlies a layer of amorphous semiconductor 9. The method of claim 1 wherein the device is a constituent of an integrated circuit with exposed silicon that is to be subsequently covered with a metal.

10. The method of claim 1 wherin the rinsing of the non-sensitive or back side is followed by air drying and metallic deposition, to provide the final contacting element, followed by heating at 150° C. for about 4 hours.

11. A device with intraconnected electrodes, comprising:
   a substrate;
   a first electrode upon said substrate;
   an amorphous semiconductor upon said first electrode;
   a metal hydroxide adsorbed on portions of said first electrode and on said amorphous semiconductor, brought about by dipping in a colloidal solution or a well stirred suspension of the said metal hydroxide in water;
   and a second electrode upon said semiconductor extending into contact with said first electrode at the interface of said first electrode with metal hydroxide.

12. The device of claim 11 wherein the metal hydroxide is nickel hydroxie.

13. The device of claim 11 wherein the metal hydroxide is chromium hydroxide.

14. The invention of claim 11 wherein the said device
   is a solar panel comprising a substrate with a plurality of discrete, transparent, first electrodes thereon;
   a layer of amorphous semiconductor upon the transparent electrode;
   a plurality of second, back electrodes upon said semiconductor layer and opposite the transparent electrodes;
   an interface between a portion of each discrete transparent, first electrode and the opposite, second, back electrode with said metal hydroxide present at said interface;
   and an interface between the amorphous semiconductor and each of the second, back electrode with metal hydroxide at each said interface;
   thereby to enhance the thermal stability of said device.

15. The device of claim 11 wherein said metal hydroxide is adsorbed upon said first electrode and said amorphous semiconductor to promote better contact stability with said first electrode and interface stability between the amorphous semiconductor and the second electrode.

16. The device of claim 11 wherein the said amorphous semi conductor is silicon and promotes better interface stability between the silicon and the second electrode deposited thereon.

* * * * *